(12) United States Patent
Breyta et al.

(10) Patent No.: US 8,232,618 B2
(45) Date of Patent: Jul. 31, 2012

(54) SEMICONDUCTOR STRUCTURE HAVING A CONTACT-LEVEL AIR GAP WITHIN THE INTERLAYER DIELECTRICS ABOVE A SEMICONDUCTOR DEVICE AND A METHOD OF FORMING THE SEMICONDUCTOR STRUCTURE USING A SELF-ASSEMBLY APPROACH

(75) Inventors: Gregory Breyta, San Jose, CA (US); David V. Horak, Essex Junction, VT (US); Elbert E. Huang, Carmel, NY (US); Charles W. Koburger, III, Delmar, NY (US); Douglas C. La Tulipe, Jr., Guilderland, NY (US); Shom Ponoth, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 106 days.

(21) Appl. No.: 12/854,352

(22) Filed: Aug. 11, 2010

(65) Prior Publication Data
US 2012/0037962 A1   Feb. 16, 2012

(51) Int. Cl.
*H01L 29/00* (2006.01)
(52) U.S. Cl. ........ 257/522; 257/506; 257/513; 257/637; 257/E23.013
(58) Field of Classification Search .......... 257/506, 257/513, 522, 637
See application file for complete search history.

(56) References Cited

U.S. PATENT DOCUMENTS

| | | | |
|---|---|---|---|
| 5,900,668 A * | 5/1999 | Wollesen .................. 257/522 |
| 6,104,077 A * | 8/2000 | Gardner et al. ............. 257/522 |
| 6,208,015 B1 | 3/2001 | Bandyopadhyay et al. |
| 6,399,476 B2 | 6/2002 | Kim et al. |
| 6,909,128 B2 | 6/2005 | Ireland |
| 7,005,371 B2 | 2/2006 | Chinthakindi et al. |
| 7,071,091 B2 | 7/2006 | Clarke et al. |
| 7,138,718 B2 * | 11/2006 | Ahn et al. .................. 257/762 |
| 7,309,649 B2 | 12/2007 | Colburn et al. |
| 7,352,019 B2 | 4/2008 | Ireland |
| 7,371,684 B2 | 5/2008 | Colburn et al. |
| 7,422,975 B2 | 9/2008 | Nogami et al. |
| 2008/0274609 A1 | 11/2008 | Chen |
| 2008/0283937 A1 | 11/2008 | Shin |
| 2009/0008791 A1 | 1/2009 | Clevenger et al. |
| 2009/0121356 A1 | 5/2009 | Nakagawa |
| 2009/0200636 A1 | 8/2009 | Edelstein et al. |
| 2009/0289366 A1 | 11/2009 | Watanabe et al. |
| 2009/0298282 A1 | 12/2009 | Yun et al. |

OTHER PUBLICATIONS

Nealy et al., "Self-Assembling Resists for Nanolithography," IEEE, 2005, pp. 1-4.

* cited by examiner

*Primary Examiner* — Wai Sing Louie
(74) *Attorney, Agent, or Firm* — Gibb & Riley, LLC; David A. Cain, Esq.

(57) ABSTRACT

Disclosed are embodiments of a semiconductor structure having a contact-level air gap within the interlayer dielectrics above a semiconductor device in order to minimize parasitic capacitances (e.g., contact-to-contact capacitance, contact-to-diffusion region capacitance, gate-to-contact capacitance, gate-to-diffusion region capacitance, etc.). Specifically, the structure can comprise a semiconductor device on a substrate and at least three dielectric layers stacked above the semiconductor device. An air gap is positioned with the second dielectric layer aligned above the semiconductor device and extending vertically from the first dielectric layer to the third dielectric layer. Also disclosed are embodiments of a method of forming such a semiconductor structure using a self-assembly approach.

12 Claims, 15 Drawing Sheets

SEMICONDUCTOR STRUCTURE HAVING A CONTACT-LEVEL AIR GAP WITHIN THE INTERLAYER DIELECTRICS ABOVE A SEMICONDUCTOR DEVICE AND A METHOD OF FORMING THE SEMICONDUCTOR STRUCTURE USING A SELF-ASSEMBLY APPROACH

BACKGROUND

1. Field of the Invention

The embodiments relate to semiconductor structures and, more particularly, to a semiconductor structure having a contact-level air gap within the interlayer dielectrics above a semiconductor device for minimizing parasitic capacitances and a method of forming such a semiconductor structure using a self-assembly approach.

2. Description of the Related Art

Contact-level interlayer dielectrics and sidewall spacers are typically formed of a combination of dielectric materials (e.g., silicon dioxide ($SiO_2$) with a dielectric constant of 3.9, silicon nitride ($Si_3N_4$) with a dielectric constant of 7.5, etc.), thereby resulting in devices that exhibit relatively high parasitic capacitances (e.g., contact-to-contact capacitance, contact-to-diffusion region capacitance, gate-to-contact capacitance, gate-to-diffusion region capacitance, etc.). Such parasitic capacitances can increase device power consumption and can impact device performance (e.g., decrease device speed). Therefore, there is a need in the art for a semiconductor structure configured to exhibit minimal parasitic capacitance and a method of forming such a semiconductor structure.

SUMMARY

Disclosed herein are embodiments of a semiconductor structure having a contact-level air gap within the interlayer dielectrics above a semiconductor device in order to minimize parasitic capacitances (e.g., contact-to-contact capacitance, contact-to-diffusion region capacitance, gate-to-contact capacitance, gate-to-diffusion region capacitance, etc.). Specifically, the structure can comprise a semiconductor device on a substrate and at least three dielectric layers stacked above the semiconductor device. An air gap is positioned with the second dielectric layer aligned above the semiconductor device and extending vertically from the first dielectric layer to the third dielectric layer. Also disclosed are embodiments of a method of forming such a semiconductor structure using a self-assembly approach.

Generally, the embodiments of the semiconductor structure can comprise a semiconductor device (e.g., a planar field effect transistor (FET), a non-planar FET, a bipolar transistor, a diode, a resistor, etc.). Multiple dielectric layers can be stacked above the semiconductor device. These multiple dielectric layers can comprise a first dielectric layer (e.g., a conformal dielectric layer) covering the semiconductor device and extending laterally beyond the semiconductor device. Additionally, a second dielectric layer (e.g., a blanket dielectric layer) can cover the first dielectric layer and a third dielectric layer can cover the second dielectric layer. A plurality of contacts can extend through the first, second and third dielectric layers to the semiconductor device. Finally, an air gap can be located within the second dielectric layer. This air gap can extend vertically from the first dielectric layer to the third dielectric layer and can further be aligned above the semiconductor device such that at least portions of each contact are exposed within the air gap.

In one particular embodiment, the semiconductor structure can comprise a planar FET adjacent to an isolation region. The planar FET can comprise source/drain regions, a channel region positioned laterally between the source/drain regions and a gate stack on the channel region. Multiple dielectric layers can be stacked above the semiconductor device and the isolation region. These multiple dielectric layers can comprise a first dielectric layer (e.g., a conformal dielectric layer) covering the source/drain regions and the gate stack of the field effect transistor and further extending laterally over the isolation region. Additionally, a second dielectric layer (e.g., a planarized blanket dielectric layer) can cover the first dielectric layer and a third dielectric layer can cover the second dielectric layer. A plurality of contacts can extend through the first, second and third dielectric layers to the source/drain regions and gate stack of the field effect transistor. Finally, an air gap can be located within the second dielectric layer. This air gap can extend vertically from the first dielectric layer to the third dielectric layer and can further be aligned above the field effect transistor such that at least portions of each contact are exposed within the air gap.

Generally, the method embodiments for forming such semiconductor structures can comprise forming a semiconductor device (e.g., a planar field effect transistor (FET), a non-planar FET, a bipolar transistor, a diode, a resistor, etc.). Next, multiple dielectric layers can be stacked above the semiconductor device. Specifically, a first dielectric layer (e.g., a conformal dielectric layer) can be formed such that it covers the semiconductor device and extends laterally beyond the semiconductor device. Additionally, a second dielectric layer (e.g., a blanket dielectric layer) can be formed and planarized such that it covers the first dielectric layer and a third dielectric layer can be formed such that it covers the second dielectric layer. A plurality of contacts can be formed that extend through the first, second and third dielectric layers to the semiconductor device. Then, an air gap can be formed in the second dielectric layer such that it extends vertically from the first dielectric layer to the third dielectric layer and further such that it is aligned above the semiconductor device, thereby exposing at least a portion of each of the contacts.

In one particular embodiment, the method can comprise forming a field effect transistor adjacent to an isolation region such that the field effect transistor comprises source/drain regions, a channel region positioned laterally between the source/drain regions, and a gate stack on the channel region. Next, multiple dielectric layers can be stacked above the field effect transistor and the isolation region. Specifically, a first dielectric layer (e.g., a conformal dielectric layer) can be formed such that it covers the source/drain regions and the gate stack of the field effect transistor and further such that it extends laterally over the isolation region. Additionally, a second dielectric layer (e.g., a blanket dielectric layer) can be formed and planarized such that it covers the first dielectric layer and a third dielectric layer can be formed such that it covers the second dielectric layer. A plurality of contacts can be formed that extend through the first, second and third dielectric layers to the source/drain regions and gate stack of the field effect transistor. Then, an air gap can be formed in the second dielectric layer such that it extends vertically from the first dielectric layer to the third dielectric layer and further such that it is aligned above the semiconductor field effect transistor, thereby exposing at least a portion of each of the contacts.

BRIEF DESCRIPTION OF THE SEVERAL VIEWS OF THE DRAWINGS

The embodiments of the invention will be better understood from the following detailed description with reference to the drawings, which are not necessarily drawing to scale and in which.

DETAILED DESCRIPTION

The embodiments of the invention and the various features and advantageous details thereof are explained more fully with reference to the non-limiting embodiments that are illustrated in the accompanying drawings and detailed in the following description.

As discussed above, contact-level interlayer dielectrics and sidewall spacers are typically formed of a combination of dielectric materials (e.g., silicon dioxide ($SiO_2$) with a dielectric constant of 3.9, silicon nitride ($Si_3N_4$) with a dielectric constant of 7.5, etc.), thereby resulting in devices that exhibit relatively high parasitic capacitances (e.g., contact-to-contact capacitance, contact-to-diffusion region capacitance, gate-to-contact capacitance, gate-to-diffusion region capacitance, etc.). Such parasitic capacitances can increase device power consumption and can impact device performance (e.g., decrease device speed).

Various techniques can be used to minimize these parasitic capacitances. For example, $SiO_2$ can be used as both the interlayer dielectric material and sidewall spacer material, avoiding the use of $Si_3N_4$ altogether, in order to reduce parasitic capacitance. Unfortunately, $SiO_2$ does not stand up well to typical middle of the line (MOL) processes including, but not limited to, silicide precleaning. Alternatively, sacrificial $Si_3N_4$ sidewall spacers can be formed and, following silicide formation, selectively replaced with sidewall spacers having a lower dielectric constant (e.g., $SiO_2$ sidewall spacers). While these techniques reduce parasitic capacitances, there is still a need in the art for a semiconductor structure configured to exhibit even less parasitic capacitance and a method of forming such a semiconductor structure.

Therefore, disclosed herein are embodiments of a semiconductor structure having a contact-level air gap within the interlayer dielectrics above a semiconductor device in order to minimize parasitic capacitances (e.g., contact-to-contact capacitance, contact-to-diffusion region capacitance, gate-to-contact capacitance, gate-to-diffusion region capacitance, etc.). Specifically, the structure can comprise a semiconductor device on a substrate and at least three dielectric layers stacked above the semiconductor device. An air gap is positioned with the second dielectric layer aligned above the semiconductor device and extending vertically from the first dielectric layer to the third dielectric layer. Also disclosed are embodiments of a method of forming such a semiconductor structure using a self-assembly approach.

Figure 1A:
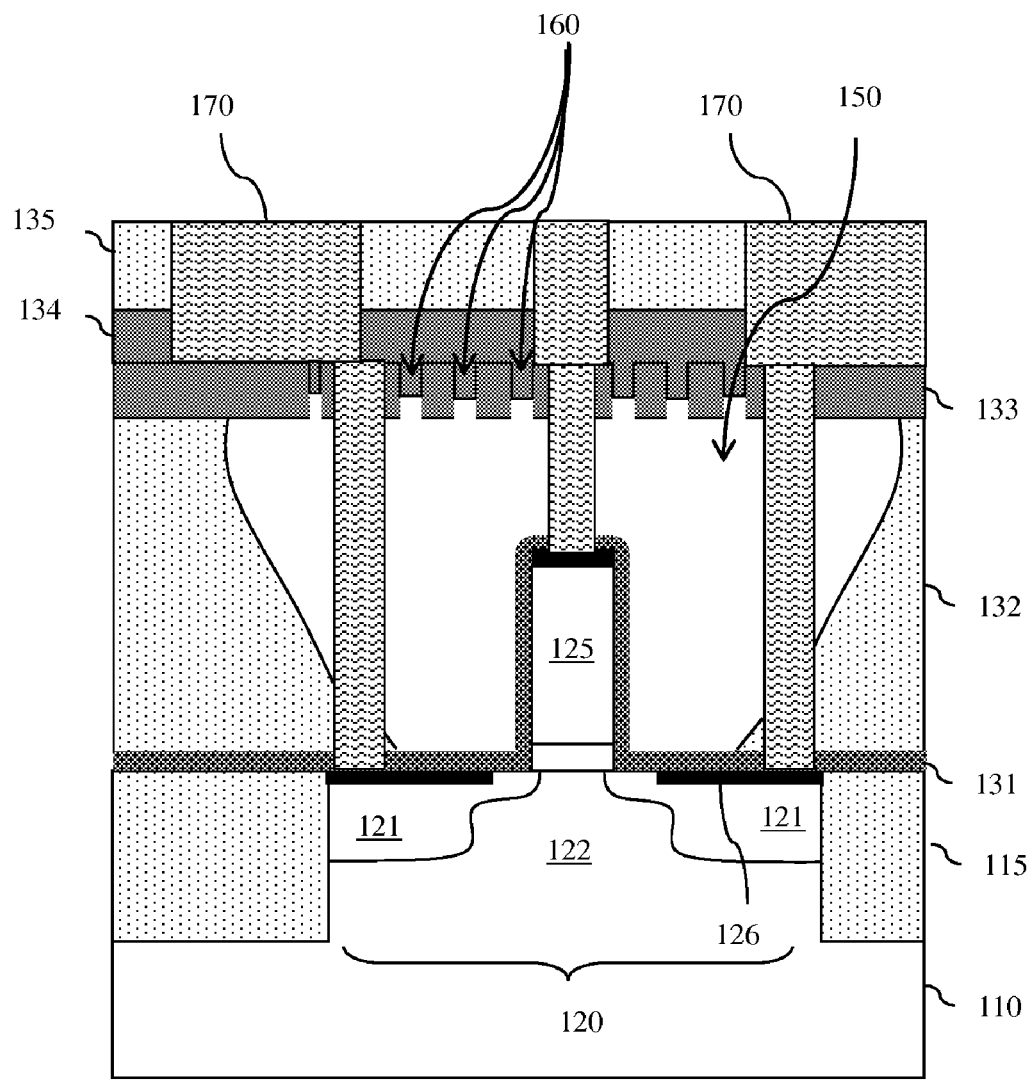
FIG. 1a is a cross-section view drawing illustrating an embodiment of a semiconductor structure according to the present invention.
Figure 1B:
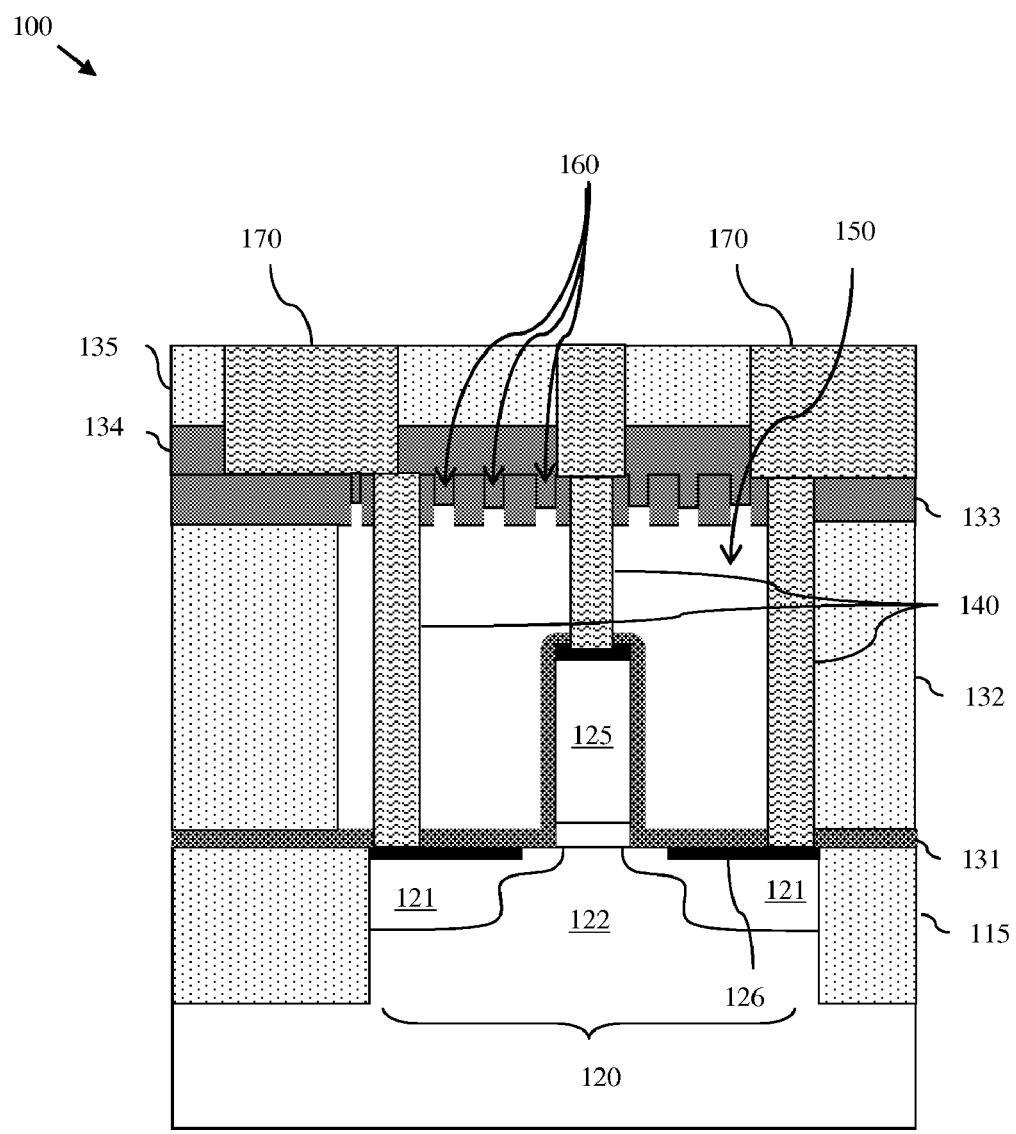
FIG. 1b is a cross-section view drawing illustrating an alternative embodiment of a semiconductor structure according to the present invention.

Referring to FIGS. 1a and 1b, embodiments of the semiconductor structure 100 can comprise a semiconductor device 120. The device 120 can comprise, for example, a field effect transistor (FET) (e.g., a planar FET or a non-planar FET, such as a dual-gate fin-type FET or a tri-gate FET), a bipolar transistor, a diode, a resistor, etc. This device 120 can be formed on a bulk semiconductor wafer (as shown) or, alternatively, on a semiconductor-on-insulator (SOI) wafer.

As shown in FIGS. 1a and 1b, the semiconductor structure 100 can comprise a planar FET. Specifically, this planar FET can comprise source/drain regions 121 appropriately doped with n-type or p-type dopants, depending upon the conductivity type of the transistor. A channel region 122 can be positioned laterally between the source/drain regions 121 and a gate stack 125, including a gate dielectric layer and gate conductor layer, can be positioned on (e.g., above, as shown) the channel region 122. Optionally, silicide layers 126 can be positioned on the source/drain regions 121 and gate stack 125. An isolation region 115 can be positioned laterally adjacent to the planar FET and, more particularly, can border and, thereby define the active regions of the planar FET. Various different planar FET and isolation region configurations are well-known in the art and can be incorporated into the semiconductor structure 100. Thus, the details of such planar FET and isolation region configurations are omitted from this specification in order to allow the reader to focus on the salient aspects of the embodiments described.

Multiple dielectric layers can be stacked above the semiconductor device 120 (e.g., above the planar FET). Specifically, a first dielectric layer 131 (e.g., a conformal dielectric layer, a dielectric liner) can cover the semiconductor device 120 and can extend laterally beyond the semiconductor device 120. For example, in the case of a planar FET, the conformal first dielectric layer 131 can cover the source/drain regions 121 and gate stack 125 and can further extend laterally over the isolation region 115. A second dielectric layer 132 (e.g., a planarized blanket dielectric layer) can cover the first dielectric layer 131. Thus, for example, in the case of a planar FET, the top surface of the second dielectric layer 132 can be approximately planar and can be above the level of the top surface of the gate stack 125. A third dielectric layer 133 can cover the second dielectric layer 132.

A plurality of contacts 140 can extend through the first, second and third dielectric layers 131-133 to the semiconductor device 120. For example, in the case of a planar FET, these contacts 140 can extend to the source/drain regions 121 and to the gate stack 125 or, optionally, to silicide layers 126 on the source/drain regions 121 and gate stack 125. These contacts 140 can comprise, for example, conductor-filled contact holes (i.e., contact holes or openings that are, optionally, lined with a conductive barrier layer (e.g., titanium nitride (TiN), tantalum nitride (TaN), tantalum (Ta) or any other conductive barrier material suitable for preventing diffusion of contact conductor material into adjacent dielectric and/or semiconductor materials and/or suitable for preventing oxidation of the contact conductor material) and filled with a conductor, such as copper (Cu), aluminum (Al) or some other suitable contact metal or contact metal alloy). It should be noted that, for illustration purposes, the source/drain contacts and gate stack contact are shown in cross-section diagram of FIG. 1 as being aligned in the same vertical plane; however, those skilled in the art will recognize that oftentimes these contacts are offset (i.e., not aligned in the same vertical plane) for ease of back end of the line (BEOL) wiring.

To minimize parasitic capacitance, the semiconductor structure 100 can further comprise an air gap 150 located within the second dielectric layer 132. This air gap 150 can extend vertically from the first dielectric layer 131 to the third dielectric layer 133 and can further be aligned above the semiconductor device 120. Specifically, the air gap 150 and the semiconductor device 120 can preferably have approximately equal area measurements such that the outer boundaries of the air gap 150 and the semiconductor device 120 are approximately aligned. For example, in the case of a planar FET, the outer boundaries of the air gap 150 can extend laterally to approximately the interface between the active device regions (i.e., the source/drain regions 121 and channel region 122) and the isolation region 115. Thus, at least portions of each contact 140 are exposed within the air gap 150 and, more specifically, at least those portions of each contact 140 that are within the second dielectric layer 132 facing other device contacts 140 (and, in the case of a FET, the gate stack 125) are exposed within the air gap 150. Those skilled in the art will recognize that such an air gap 150 has a dielectric constant of approximately 1.0 and, thereby reduces parasitic capacitances (e.g., contact-to-contact capacitance, contact-to-diffusion region capacitance, gate-to-contact capacitance, gate-to-diffusion region capacitance, etc.) over those that would be present if the second dielectric layer 132 remained intact or solid. However, preferably, the air gap 150 does not or, as shown, only minimally extends laterally beyond the semiconductor device 120 (e.g., over the isolation region 115) so that the remaining portions of the second dielectric layer 132 can provide adequate structural support for the BEOL wiring.

As a function of the technique used to form this air gap 150, as discussed in greater detail below with regard to the method embodiments, the semiconductor structure 100 can further comprise a number of additional features. Specifically, the shape of the air gap 150 may vary. For example, as shown in FIG. 1a, the upper portion of the air gap 150 (i.e., the portion closest to the third dielectric layer 133) may be wider than the lower portion (i.e., the portion closest to the first dielectric layer 131). Alternatively, as shown in FIG. 1b, the shape of the air gap 150 may be essentially uniform (i.e., have essentially the same dimensions in the upper portion as the lower portion).

In addition, the third dielectric layer 133 can further comprise a plurality of patterned openings 160 positioned above the semiconductor device 120 and required during processing in order to etch the air gap 150 in the second dielectric layer 132. Furthermore, the second dielectric layer 132 can comprise a different dielectric material than both the first dielectric layer 131 and the third dielectric layer 133 so that during processing the air gap 150 can be etched in the second dielectric layer 132 stopping below on the first dielectric layer 131 and above on the third dielectric layer 133. That is, the first and third dielectric layers 131 and 133 can be either the same as or different from each other, but should be selected so that they have a relatively low or zero etch rate in the etch chemistry used to form the air gap 150 in the second dielectric layer 132. For example, the first dielectric layer 131 can comprise a silicon nitride layer ($Si_3N_4$), the second dielectric layer 132 can comprise a silicon dioxide layer ($SiO_2$), and the third dielectric layer 133 can comprise a nitrogen-doped silicon carbide layer (SiCN), a hydrogenated silicon oxycarbide layer (SiCOH) or another ultra-low K dielectric layer, etc. Thus, during processing, the second dielectric layer 132 can be isotropically and selectively etched over the first and third dielectric layers 131 and 133 using a selective wet etch chemistry, for example, of dilute hydrofluoric acid (DHF).

Finally, the multiple dielectric layers stacked above the semiconductor device 120 can further comprise a fourth dielectric layer 134 and a fifth dielectric layer 135. The fourth dielectric layer 134 can cover the third dielectric layer 133 and fill in the openings 160. Thus, the fourth dielectric layer 134 encloses the air gap 150 and provides additional support for the BEOL wiring. This fourth dielectric layer 134 can comprise, for example, the same dielectric material as either the first dielectric layer 131 or the third dielectric layer 131 (e.g., a silicon nitride layer ($Si_3N_4$), a nitrogen-doped silicon carbide layer (SiCN), a hydrogenated silicon oxycarbide layer (SiCOH) or another ultra-low K dielectric layer, etc.). The fifth dielectric layer 135 can cover the fourth dielectric layer 134 and can comprise, for example, either the same dielectric material as the second dielectric layer 132 (e.g., a silicon dioxide layer ($SiO_2$)) or the same dielectric material as the fourth dielectric layer 134 (e.g., a silicon nitride layer ($Si_3N_4$), a nitrogen-doped silicon carbide layer (SiCN), a hydrogenated silicon oxycarbide layer (SiCOH) or another ultra-low K dielectric layer, etc.). For the first BEOL wiring level (i.e., the M1 level), wire interconnect structures 170 can extend vertically through the fifth dielectric layer 135 and the fourth dielectric layer 135 to the contacts 140.

Figure 2:
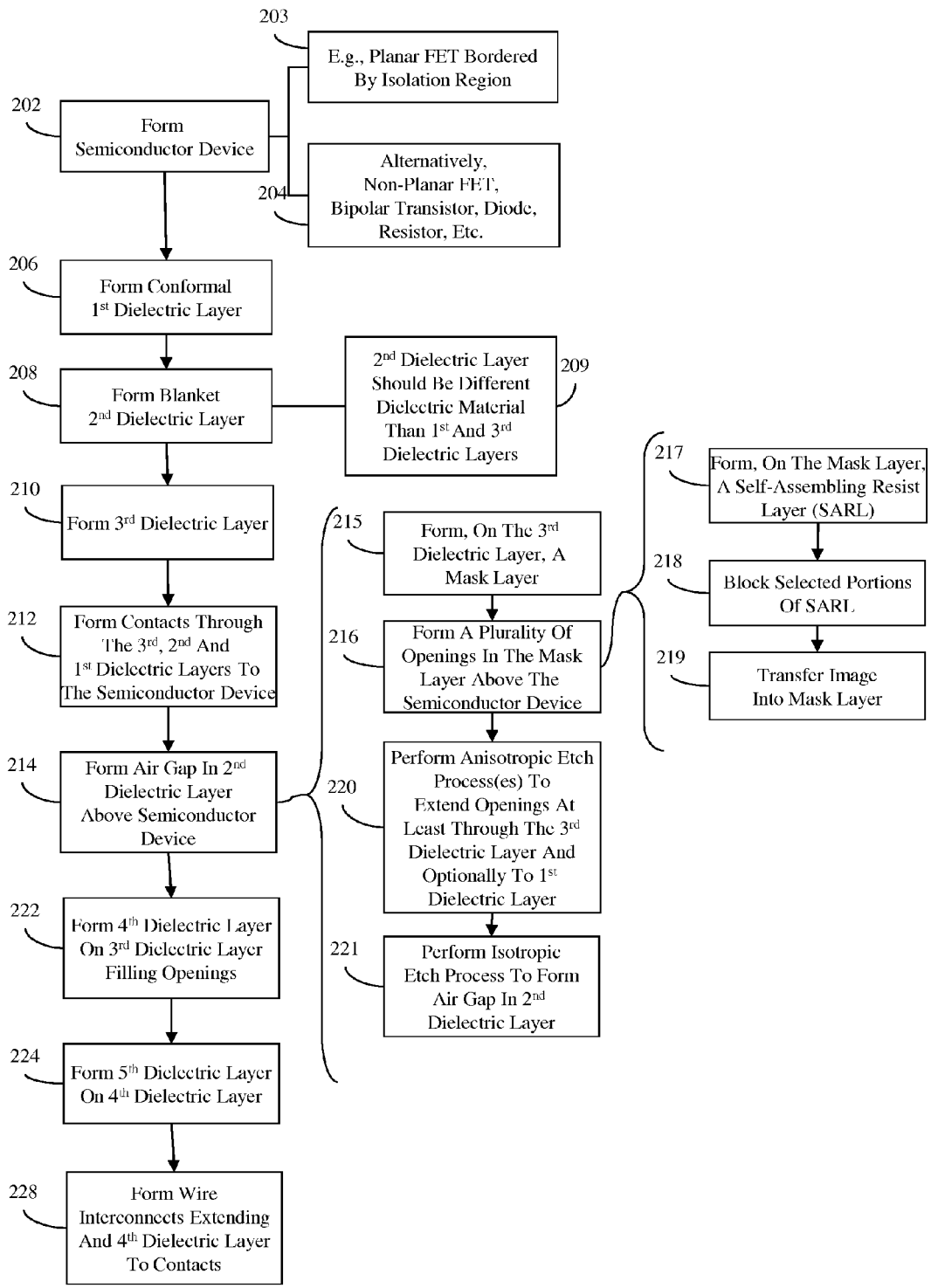
FIG. 2 is a flow diagram illustrating an embodiment of a method of forming a semiconductor structure.
Figure 3:
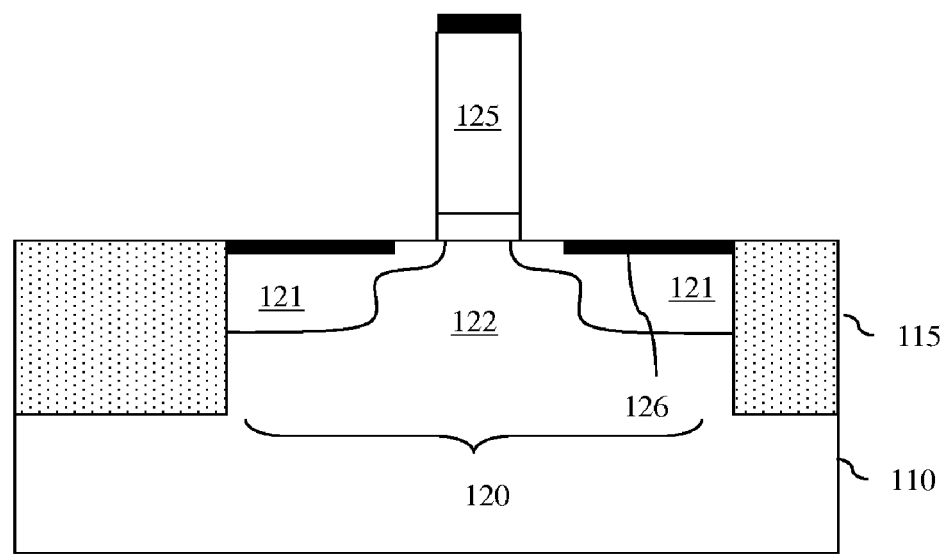
FIG. 3 is a cross-section view drawing illustrating a partially completed semiconductor structure formed according to the method of FIG. 2.

Referring to FIG. 2, also disclosed herein are embodiments of a method of forming the above-described semiconductor structure. The method embodiments can comprise, using conventional processing techniques to form a semiconductor device 120 on a wafer. Specifically, a planar FET (203, see FIG. 3) or, alternatively, another type of semiconductor device, such as a non-planar FET (e.g., a dual-gate fin-type FET or a tri-gate FET), a bipolar transistor, a diode, a resistor, etc., (204) can be formed on a wafer (e.g., on a bulk semiconductor wafer or a semiconductor-on-insulator (SOI) wafer).

For example, an isolation region 115 (e.g., a shallow trench isolation (STI) region) can be formed on a starting wafer so as to define an area within which a planar FET will be formed. A gate stack 125 can be formed on a designated channel region 122 within this defined area. Additionally, source/drain regions 121 that are appropriately doped with N-type or P-type dopants (depending upon the conductivity type of the FET being formed) can be formed adjacent to opposing sides of the gate stack 125 such that the channel region 122 is positioned laterally between them. Optional silicide layers 126 can also be formed on the top surfaces of the source/drain regions 121 and the gate stack 125. Various different planar FET and isolation region configurations as well as the techniques for forming them are well-known in the art. Thus, the details are omitted from this specification in order to allow the reader to focus on the salient aspects of the embodiments described.

Figure 4:
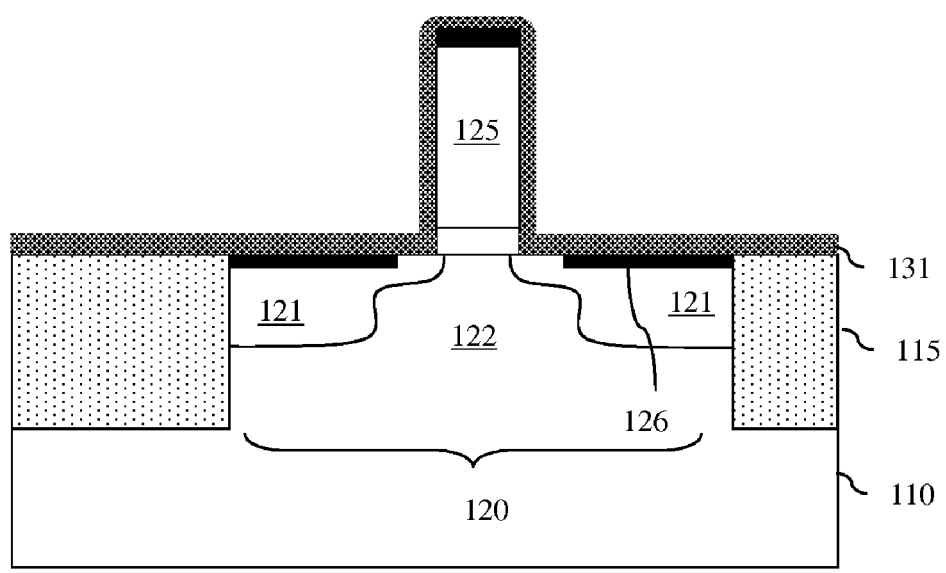
FIG. 4 is a cross-section view drawing illustrating a partially completed semiconductor structure formed according to the method of FIG. 2.
Figure 5:
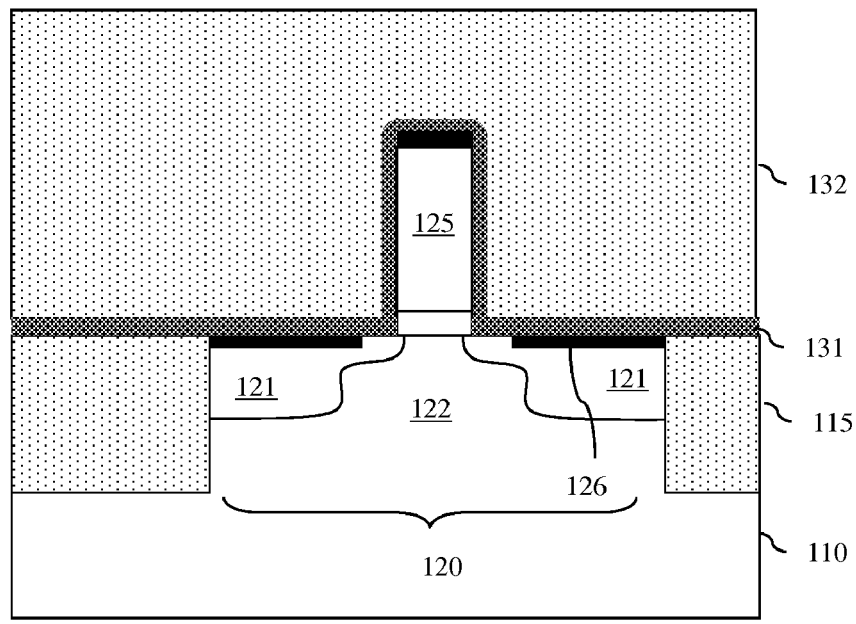
FIG. 5 is a cross-section view drawing illustrating a partially completed semiconductor structure formed according to the method of FIG. 2.
Figure 6:
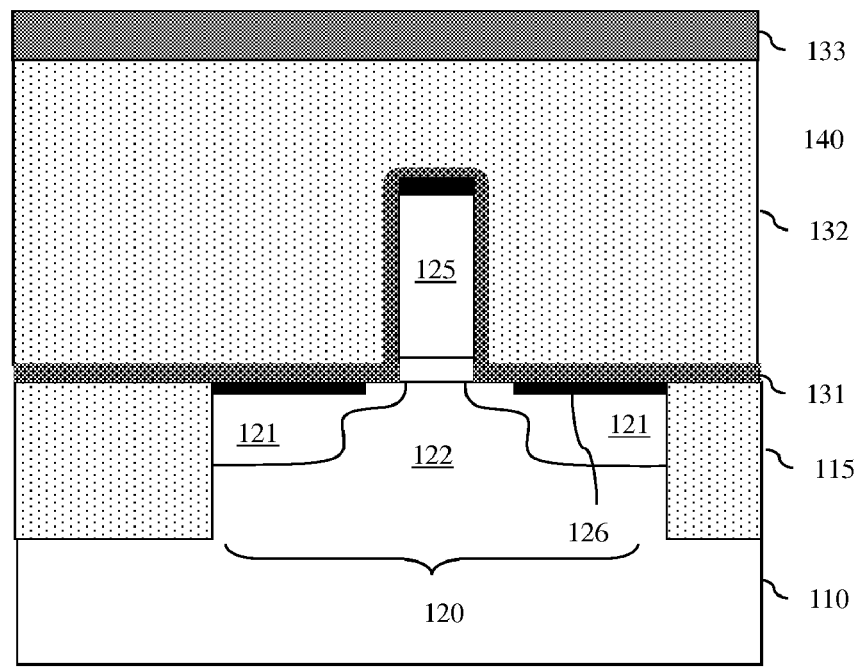
FIG. 6 is a cross-section view drawing illustrating a partially completed semiconductor structure formed according to the method of FIG. 2.

Next, multiple dielectric layers can be stacked above the semiconductor device 120. Specifically, a relatively thin first dielectric layer 131 (e.g., a conformal dielectric layer, a dielectric liner) can be formed (e.g., deposited) such that it covers the semiconductor device 120 and extends laterally beyond the semiconductor device 120 (206, see FIG. 4). For example, in the case of a planar FET, the conformal first dielectric layer 131 can be formed such that it covers the source/drain regions 121 and gate stack 125 and further such that it extends laterally over the isolation region 115. Additionally, a relatively thick second dielectric layer 132 (e.g., a blanket dielectric layer) can be formed (e.g., deposited) such that it covers the first dielectric layer 131 (208, see FIG. 5). Specifically, in the case of a planar FET, the blanket second dielectric layer 132 can be deposited and then planarized so that the top surface of the second dielectric layer 132 remains above the level of the top surface of the gate stack 125. Then, a relatively thin third dielectric layer 133 can be formed (e.g., deposited) such that it covers the second dielectric layer 132 (210, see FIG. 6).

Figure 7:
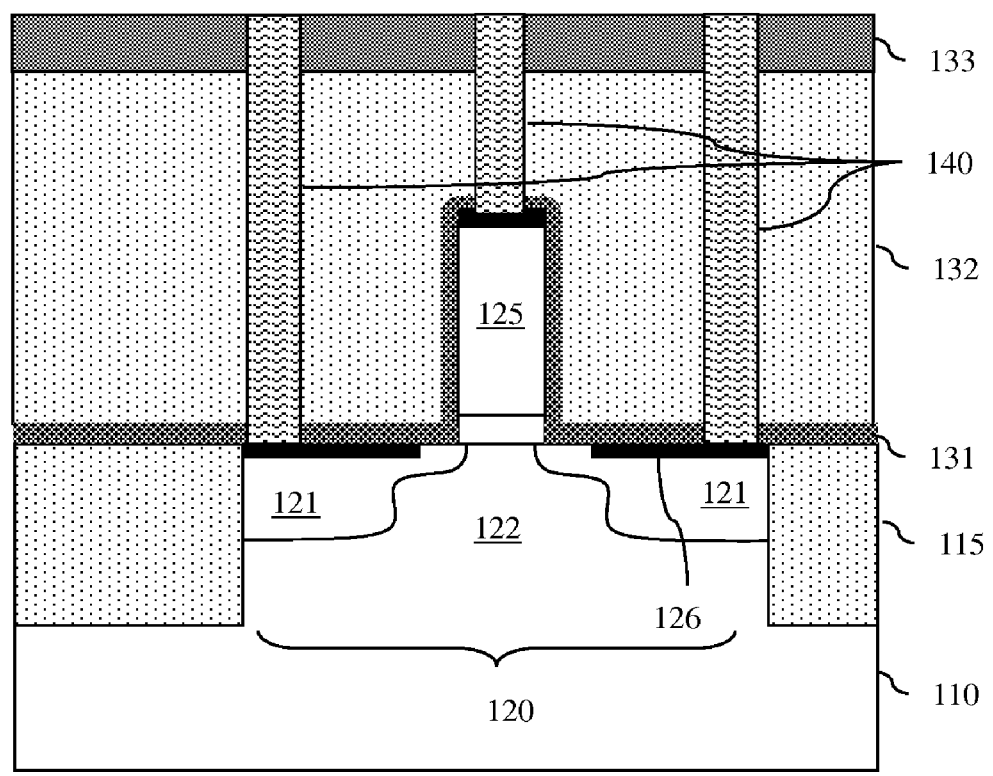
FIG. 7 is a cross-section view drawing illustrating a partially completed semiconductor structure formed according to the method of FIG. 2.

After the first, second and third dielectric layers 131-133 are formed, a plurality of contacts 140 can be formed so that they extend through the first, second and third dielectric layers 131-133 to the semiconductor device 120 (212, see FIG. 7). For example, in the case of a planar FET, these contacts 140 can be formed so that they extend to the source/drain regions 121 and to the gate stack 125 or, optionally, to silicide layers 126 on the source/drain regions 121 and gate stack 125. Specifically, conventional processing techniques can be used to pattern contact holes through the dielectric layers 131-133, to, optionally, line the contact holes with a conductive barrier layer (e.g., titanium nitride (TiN), tantalum nitride (TaN), tantalum (Ta) or any other conductive barrier material suitable for preventing diffusion of contact conductor material into adjacent dielectric and/or semiconductor materials and/or suitable for preventing oxidation of the contact conductor material) and to fill the holes with a conductor (e.g., copper (Cu), aluminum (Al) or some other suitable contact metal or contact metal alloy). It should be noted that, for illustration purposes, the source/drain contacts and gate stack contact are shown in the cross-section diagram of FIG. 7 as being aligned in the same vertical plane; however, those skilled in the art will recognize that oftentimes these contacts are offset (i.e., not aligned in the same vertical plane) for ease of back end of the line (BEOL) wiring.

To minimize parasitic capacitance, after the contacts 140 are formed at process 212, an air gap 150 (as shown in FIG. 1a or 1b) can be formed in the second dielectric layer 132 such that it extends vertically from the first dielectric layer 131 to the third dielectric layer 133 and further such that it is aligned above the semiconductor device 120 (214). Specifically, the air gap 150 can be formed so that it and the semiconductor device 120 preferably have approximately equal area measurements with the outer boundaries of the air gap 150 and the semiconductor device 120 being approximately aligned. For example, in the case of a planar FET, the air gap 150 can be formed such that the outer boundaries of the air gap 150 extend laterally to approximately the interface between the active device regions (i.e., the source/drain regions 121 and channel region 122) and the isolation region 115. It should be noted that to ensure structural integrity, the air gap 150 should be formed so that it does not or only minimally (as shown) extend laterally beyond the outer boundaries of the FET (i.e., over the isolation regions 115). Various techniques can be used to form such an air gap 150.

In one exemplary technique, the air gap 150 can be formed by first forming (e.g., depositing) a mask layer 701 on the third dielectric layer 133 (215). This mask layer 701 can comprise, for example, an organic planarizing layer (OPL), such as an anti-reflective coating, a carbon containing polymer material, etc.

Figure 8:
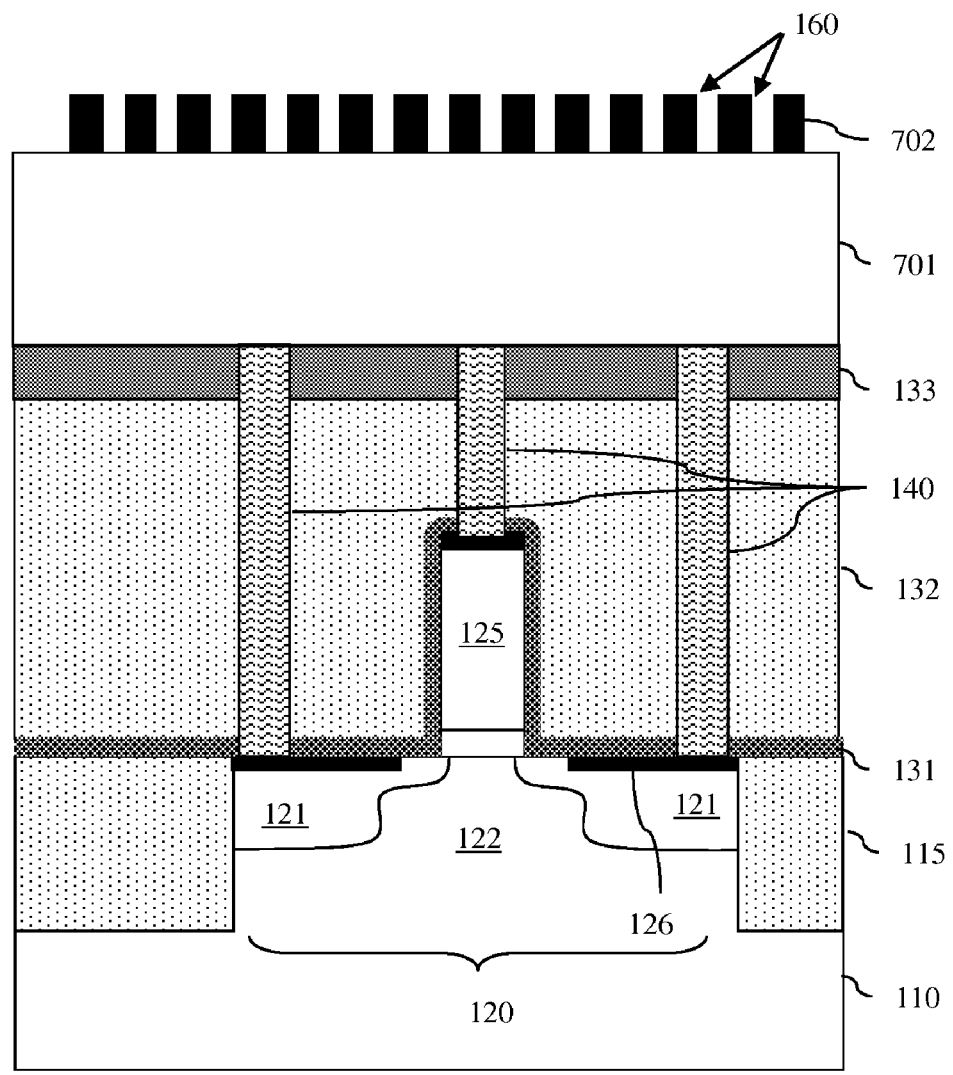
FIG. 8 is a cross-section view drawing illustrating a partially completed semiconductor structure formed according to the method of FIG. 2.
Figure 9:
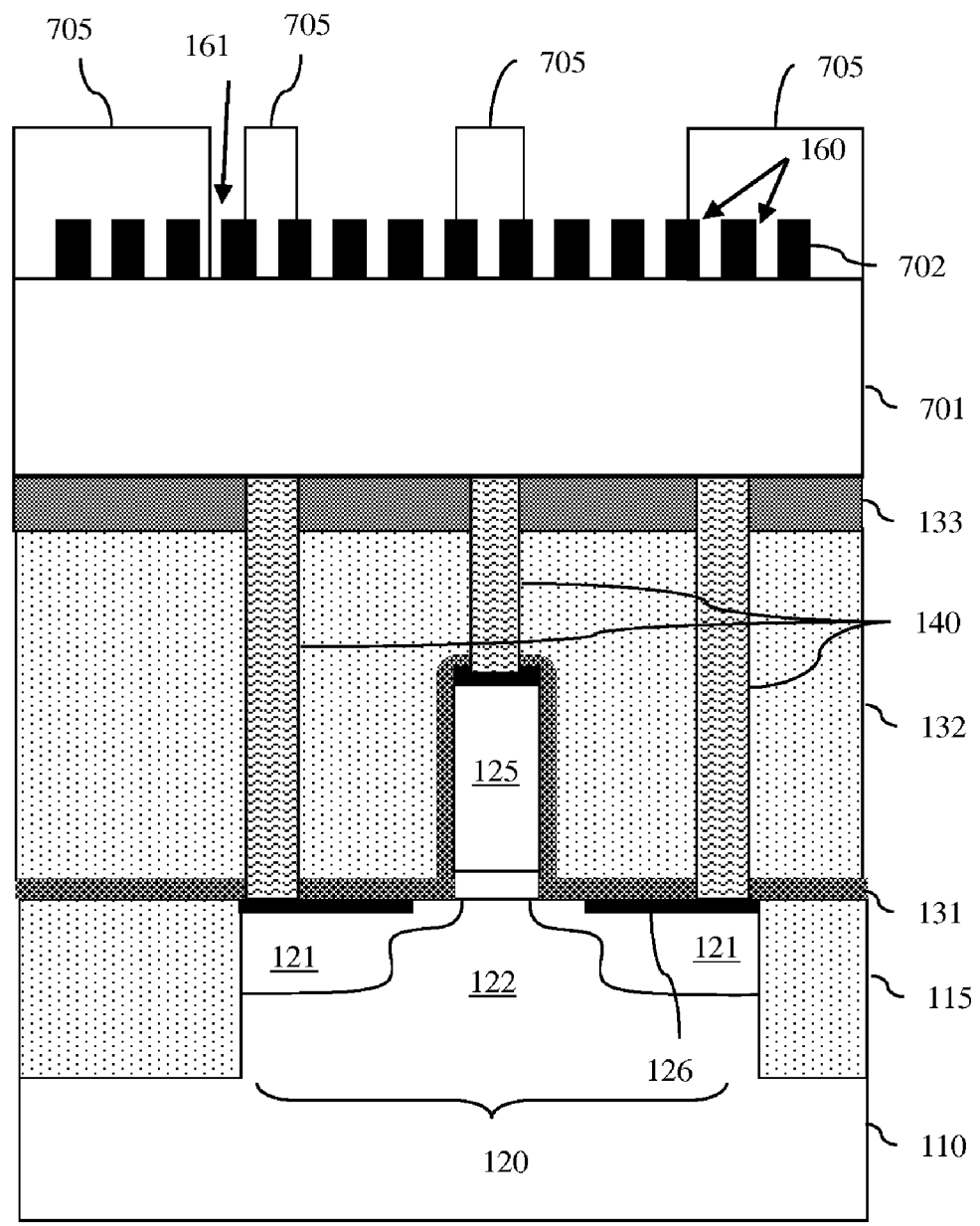
FIG. 9 is a cross-section view drawing illustrating a partially completed semiconductor structure formed according to the method of FIG. 2.
Figure 10:
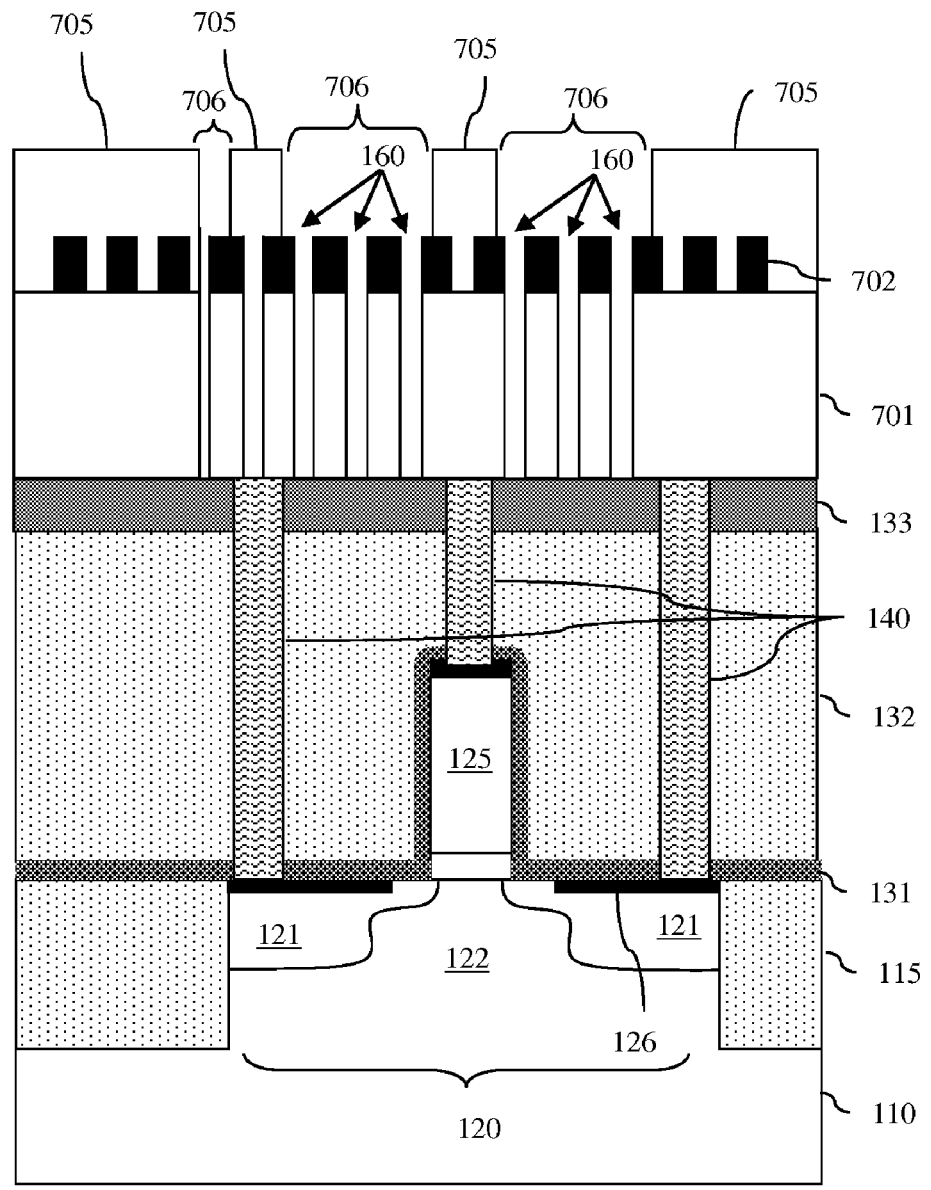
FIG. 10 is a cross-section view drawing illustrating a partially completed semiconductor structure formed according to the method of FIG. 2.

Then, a plurality of openings can be formed in the mask layer 701 above the semiconductor device 120 (216). Various techniques can be used to form such openings in the mask layer 701. In one exemplary technique, a self-assembling layer 702 can be formed on the mask layer 701 (217, see FIG. 8). This self-assembly resist layer may be tailored to have a periodic pattern of openings 160 with relatively small dimensions (e.g., dimensions of less than 50 nm and preferably of approximately 20 nm). Specifically, to form the self-assembling resist layer, a periodic chemical pattern can be formed on the top surface of the mask layer 701 such that adjacent sections of the top surface of the mask layer 701 have contrasting chemical functionalities. This chemical pattern can be formed, for example, using known exposure tools capable of resolving patterns having dimensions of 50 nm or even less. Next, a copolymer mixture (e.g., a mixture of polystyrene (PS) and poly-(methylmethacrylate) (PMMA) or any other suitable block polymer materials) can be applied to the mask layer 701 above the chemical pattern and an anneal process can be performed. The anneal process causes self-assembly of different polymer sections registered with the periodic chemical pattern previously formed on the top surface of the mask layer 701 (i.e., alternating first and second polymer sections). Those skilled in the art will recognize that the different polymer sections generated by the anneal process will depend upon the chemical pattern and the mass ratio of the block polymers used. In this case, alternating two-dimensional lamellae are preferred so a copolymer mixture having symmetric block polymers with an approximately 50:50 ratio can be used. Next, either the first polymer sections or the second polymer sections are selectively removed, leaving the periodic pattern of openings 160. Once the self-assembling layer 702 is formed, selected portions of this layer 702 (e.g., portions above the contacts 140, portions above the substrate or isolation regions 115 adjacent to the semiconductor device 120, portions above other devices, which are on the wafer and which do not require reduced parasitic capacitance, etc.) can be masked (e.g., by mask layer 705), using conventional photolithographic masking techniques (218, see FIG. 9). While mask layer 705 is preferably patterned so as to completely cover any of the openings 160 above the isolation regions 115, this may not be achievable due to overlay tolerances, etc. (e.g., see partially masked opening 161). Then, an anisotropic etch process can be used to extend the openings 106 from the self-assembling resist layer 702 and, particularly, from the unblocked/unmasked portions 706 of the self-assembling resist layer 702 into the mask layer 701 (219, see FIG. 10).

Figure 11A:
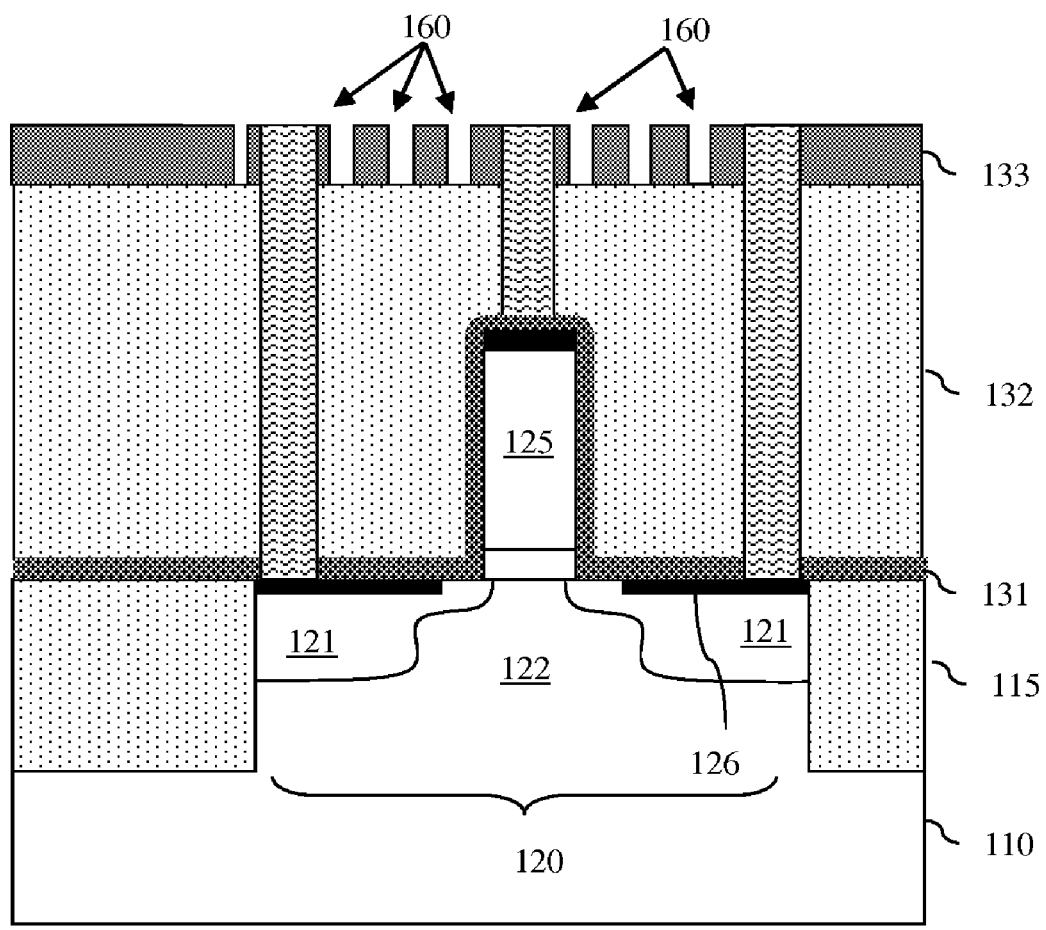
FIG. 11a is a cross-section view drawing illustrating a partially completed semiconductor structure formed according to the method of FIG. 2.

Next, one or more additional anisotropic etch processes can then be used to further extend the openings 160 at least through the third dielectric layer 133 (220, see FIG. 11a). Optionally, the etch processes 200 can extend the openings into the second dielectric layer 132. For example, in one exemplary embodiment, the openings 160 can be extended all the way through the second dielectric layer 132, stopping on the first dielectric layer 131 (see FIG. 11*b*). It should be noted that the first dielectric layer 131 should be selected so that it functions as a etch stop layer at process 220.

Figure 11B:
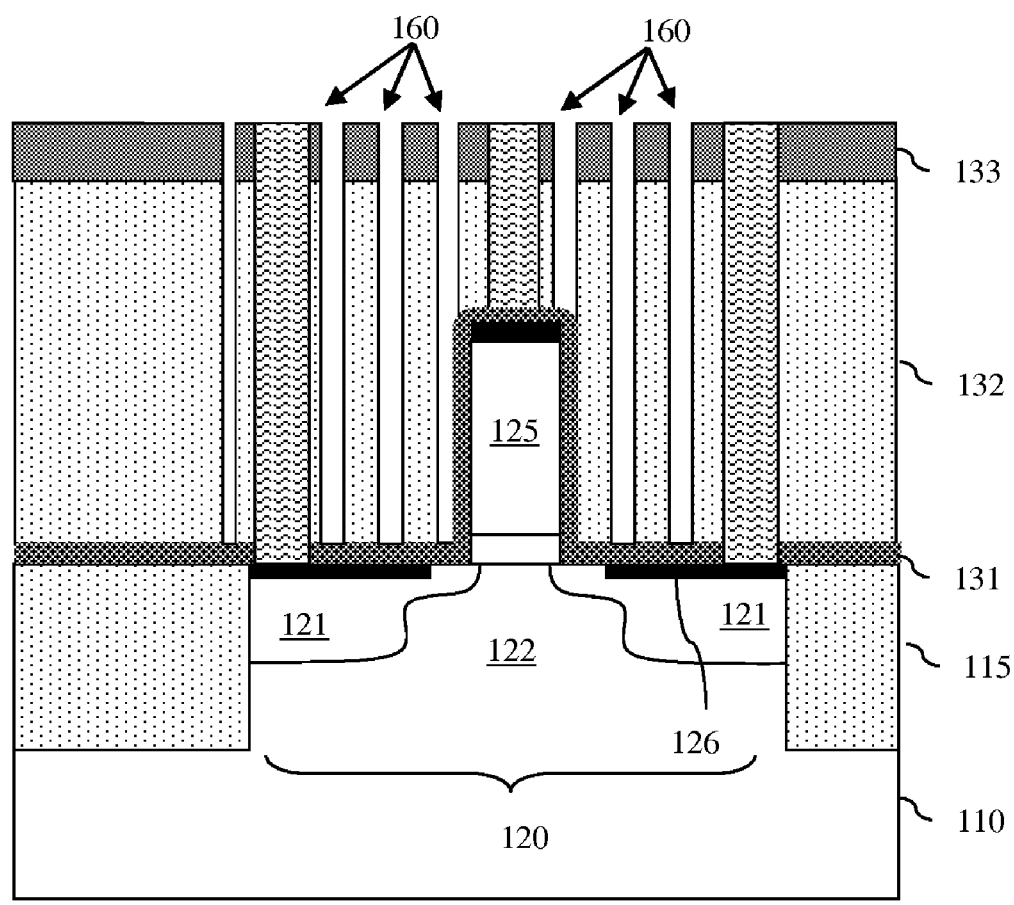
FIG. 11b is a cross-section view drawing illustrating an alternative partially completed semiconductor structure formed according to the method of FIG. 2.

Then, an isotropic etch process can be performed in order to form an air gap 150 (221). As a function of the isotropic etch process used to form this air gap 150 and further as a function of whether or not the openings 160 extend only to the third dielectric layer 133 (as in FIG. 11*a*) or extend to the first dielectric layer 131 (as shown in FIG. 11*b*), the shape of the air gap 150 may vary. For example, if the isotropic etch process begins at the top of the second dielectric layer 132 (i.e., with FIG. 11*a* as the starting point), the upper portion of the air gap 150 (i.e., the portion closest to the third dielectric layer 133 will be wider than the lower portion (i.e., the portion closest to the first dielectric layer 131) (see FIG. 12*a*). Alternatively, if the isotropic etch process begins from openings within the second dielectric layer 132 (i.e., with FIG. 11*b* as the starting point), the shape of the air gap 150 will be essentially uniform (i.e., have essentially the same dimensions in the upper portion as the lower portion) (see FIG. 12*b*). Regardless, the resulting air gap 150 and the semiconductor device 120 (e.g., the field effect transistor) should have approximately equal area measurements such that outer boundaries of the air gap 150 and the semiconductor device 120 are approximately aligned and such that the air gap 150 does not or only minimally (as shown) extend laterally beyond the semiconductor device 120 (e.g., over the isolation region 115) (221). Limiting the outer boundaries of the air gap 150 maximizes the portion of the second dielectric layer 132 that remains in order to continue to provide structural integrity (i.e., structural support) for any subsequently formed BEOL wiring.

It should be noted that processes 206, 208 and 210 discussed above should be performed such that the second dielectric layer 132 comprises a different dielectric material than both the first dielectric layer 131 and the third dielectric layer 133 so that during this isotropic etch processes 221, the air gap 150 can be etched into the second dielectric layer 132 without etching into the first dielectric layer 131 or third dielectric layer 133. That is, the first and third dielectric layers 131 and 133 can be formed at processes 206 and 210, respectively, such that they comprise either the same or different dielectric materials and further such that they each have a relatively low or zero etch rate in the etch chemistry used to form the air gap 150 in the second dielectric layer 132. For example, the first dielectric layer 131 can comprise a silicon nitride layer ($Si_3N_4$), the second dielectric layer 132 can comprise a silicon dioxide layer ($SiO_2$), and the third dielectric layer 133 can comprise a nitrogen-doped silicon carbide layer (SiCN), a hydrogenated silicon oxycarbide layer (SiCOH) or another ultra-low K dielectric layer, etc. Thus, the second dielectric layer 132 can be isotropically and selectively etched at process 221 over the first and third dielectric layers 131 and 133 using a selective wet etch chemistry, for example, of dilute hydrofluoric acid (DHF).

This technique for forming the air gap 150 leaves the first and third dielectric layers 131 and 133 intact. Additionally, it ensures that at least portions of each contact 140 will be exposed within the air gap 150 and, more specifically, it ensures that at least those portions of each contact 140 that are within the second dielectric layer 132 facing other device contacts 140 (and, in the case of a FET, facing the gate stack 125) will be exposed within the air gap 150. Those skilled in the art will recognize that such an air gap 150 has a dielectric constant of approximately 1.0 and, thereby reduces parasitic capacitances (e.g., contact-to-contact capacitance, contact-to-diffusion region capacitance, gate-to-contact capacitance, gate-to-diffusion region capacitance, etc.) over those that would be present if the second dielectric layer 132 remained intact or solid.

Figure 12A:
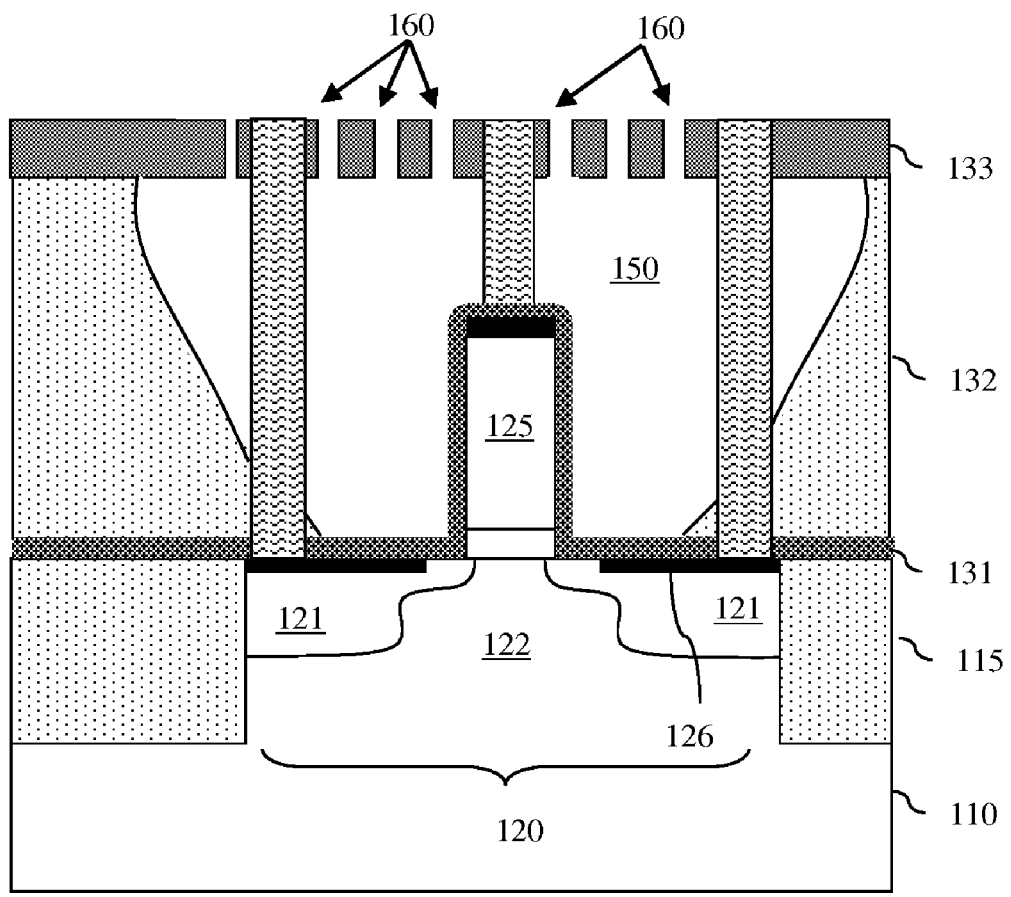
FIG. 12a is a cross-section view drawing illustrating a partially completed semiconductor structure formed according to the method of FIG. 2.
Figure 12B:
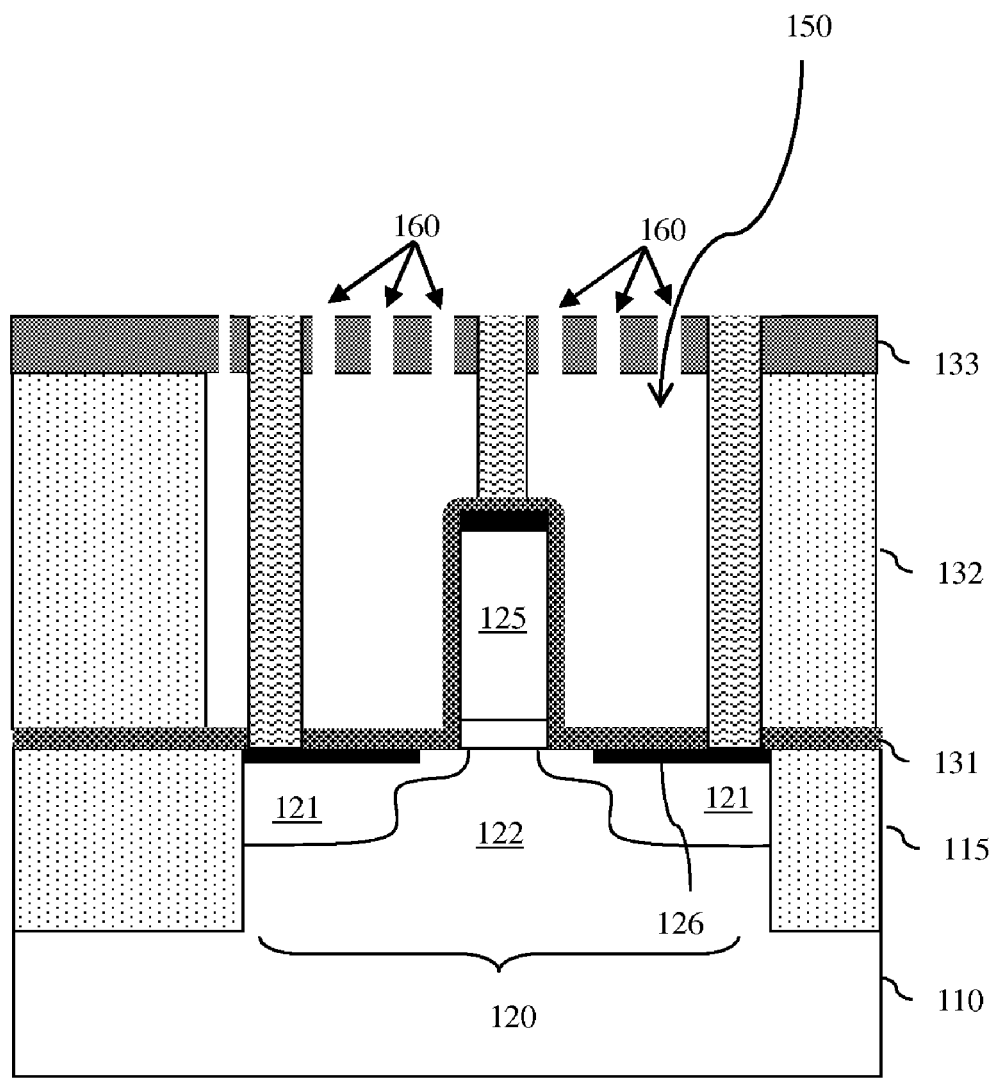
FIG. 12b is a cross-section view drawing illustrating an alternative partially completed semiconductor structure formed according to the method of FIG. 2.

For illustration purposes, the remaining process steps are shown following air gap formation as shown in FIG. 12*b*. It should be understood that these same process steps can be performed following air gap formation as shown in FIG. 12*a*.

Figure 13:
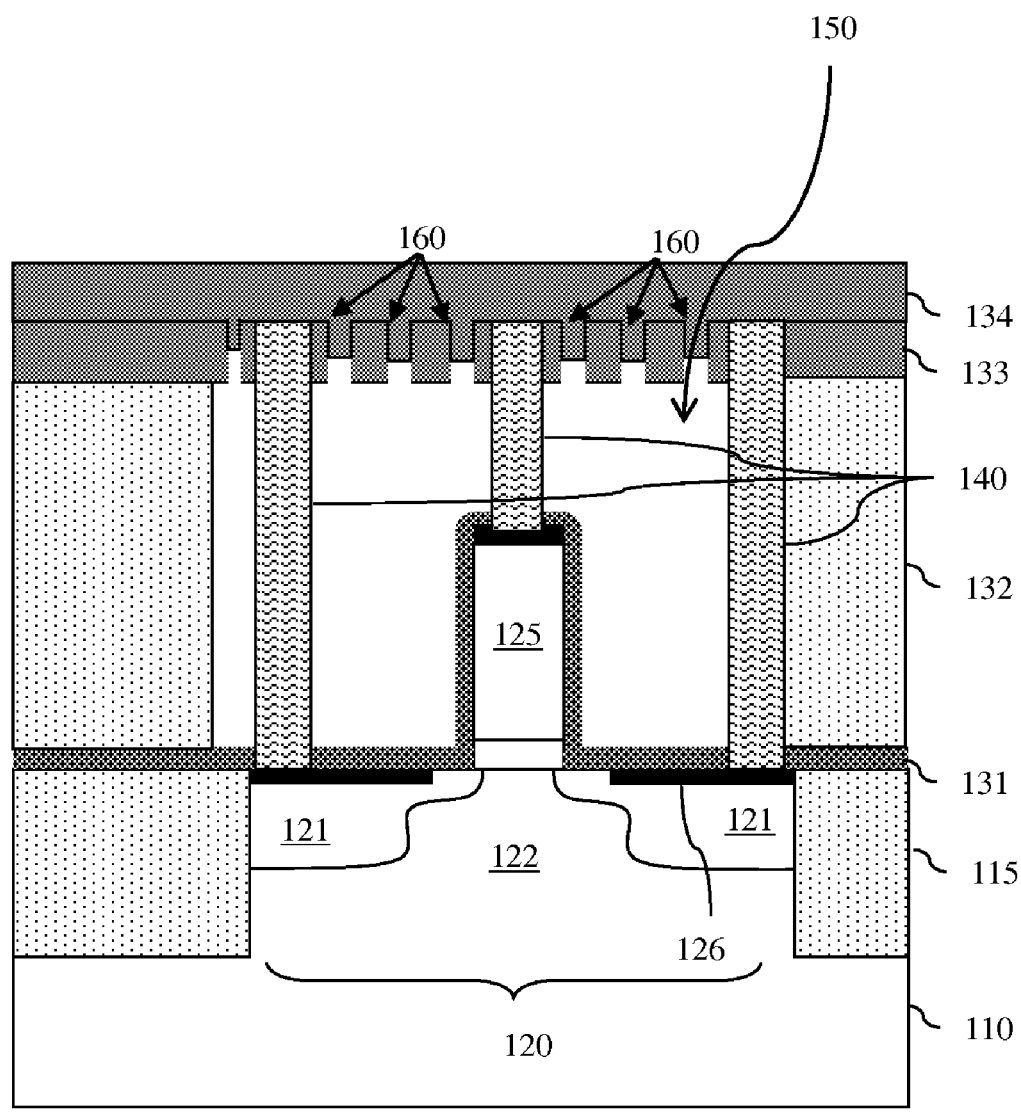
FIG. 13 is a cross-section view drawing illustrating a partially completed semiconductor structure formed according to the method of FIG. 2.

Once the air gap 150 is formed at process 214, a fourth dielectric layer 134 can be formed (e.g., deposited) such that it covers the third dielectric layer 133 and fills in the openings 160 (222, see FIG. 13). It should be noted that, due to the relatively small dimensions of the openings 160 (e.g., less than 50 nm), which can be achieved due to the self-assembly approach at process 215-220, the openings 160 fill-up, but leave the air gap 150 intact. That is, the openings 160 close up before the air gap 150 is fill-in. Thus, the fourth dielectric layer 134 encloses the air gap 150 and provides additional support for the BEOL wiring. This fourth dielectric layer 134 can comprise, for example, the same dielectric material as either the first dielectric layer 131 or the third dielectric layer 131 (e.g., a silicon nitride layer ($Si_3N_4$), a nitrogen-doped silicon carbide layer (SiCN), a hydrogenated silicon oxycarbide layer (SiCOH) or another ultra-low K dielectric layer, etc.).

Figure 14:
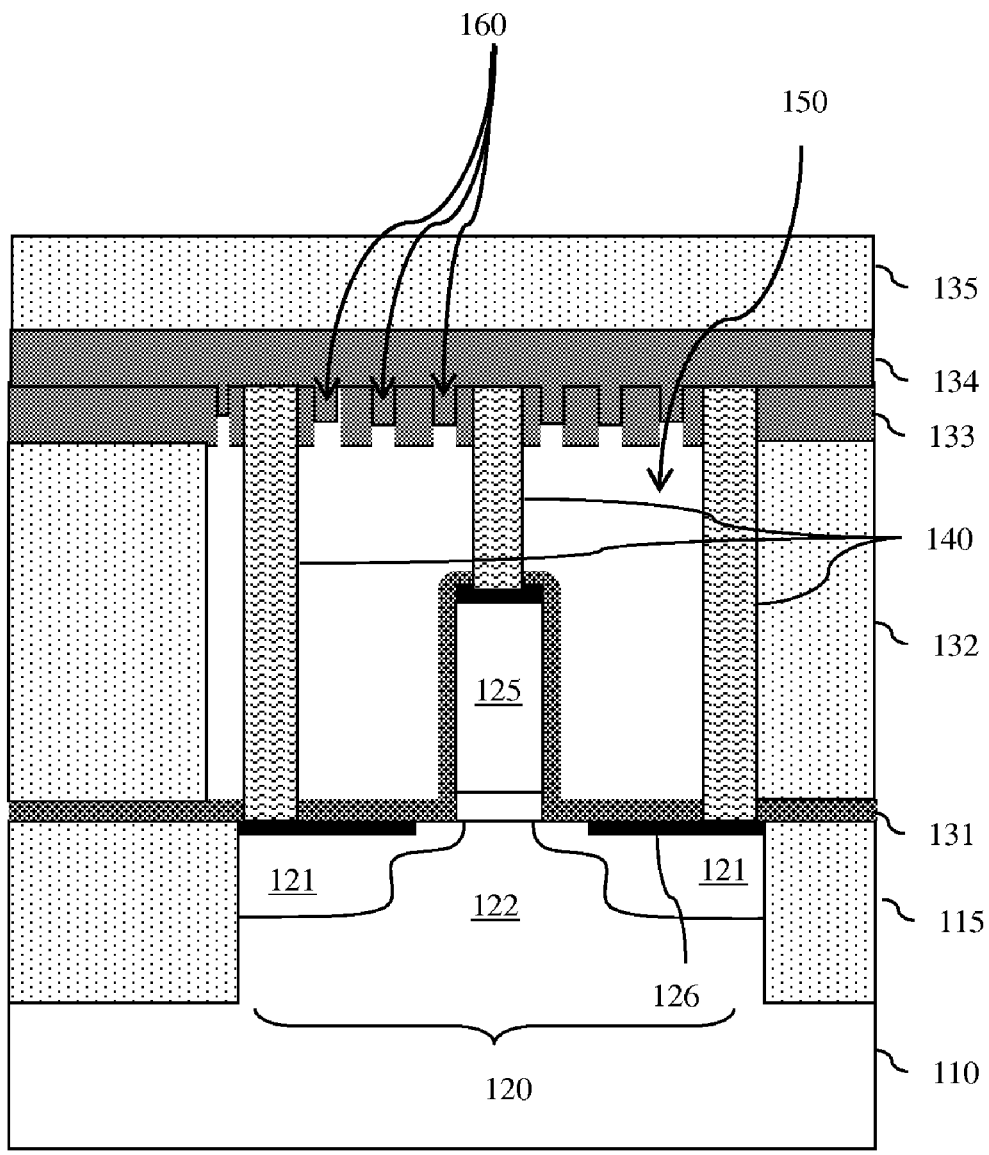
FIG. 14 is a cross-section view drawing illustrating a partially completed semiconductor structure formed according to the method of FIG. 2.

After the fourth dielectric layer 134 is formed, conventional BEOL processing can be performed. For example, a fifth dielectric layer 135 can be formed (e.g., deposited) such that it covers the fourth dielectric layer 134 (224, see FIG. 14). This fifth dielectric layer 135 can comprise, for example, either the same dielectric material as the second dielectric layer 132 (e.g., a silicon dioxide layer ($SiO_2$)) or the same dielectric material as the fourth dielectric layer 134 (e.g., a silicon nitride layer ($Si_3N_4$), a nitrogen-doped silicon carbide layer (SiCN), a hydrogenated silicon oxycarbide layer (SiCOH) or another ultra-low K dielectric layer, etc.). Then, wire interconnect structures 170 can be formed such that they extend vertically through the fifth dielectric layer 135 and the fourth dielectric layer 135 to the contacts 140 (226, see FIG. 16). BEOL processing techniques are well-known in the art. Thus, the details are omitted from this specification in order to allow the reader to focus on the salient aspects of the embodiments described.

It should be understood that the terminology used herein is for the purpose of describing particular embodiments only and is not intended to be limiting of the invention. As used herein, the singular forms "a", "an" and "the" are intended to include the plural forms as well, unless the context clearly indicates otherwise. It should further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Additionally, the corresponding structures, materials, acts, and equivalents of all means or step plus function elements in the claims below are intended to include any structure, material, or act for performing the function in combination with other claimed elements as specifically claimed. Finally, it should be understood that the description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments described were chosen in order to best explain the principles of the invention and the practical application, and to enable others of ordinary skill in the art to understand the invention for various embodiments with various modifications as are suited to the particular use contemplated.

Therefore, disclosed above are embodiments of a semiconductor structure having a contact-level air gap within the interlayer dielectrics above a semiconductor device in order to minimize parasitic capacitances (e.g., contact-to-contact capacitance, contact-to-diffusion region capacitance, gate-to-contact capacitance, gate-to-diffusion region capacitance, etc.). Specifically, the structure can comprise a semiconductor device on a substrate and at least three dielectric layers stacked above the semiconductor device. An air gap is positioned with the second dielectric layer aligned above the semiconductor device and extending vertically from the first dielectric layer to the third dielectric layer. Also disclosed are embodiments of a method of forming such a semiconductor structure using a self-assembly approach. Specifically, disclosed method embodiments use a self assembly technique to form a contact-level air-gap by selective removal of interlayer dielectric material after contact formation. Since the air gap is formed, after contact formation, the technique has the advantage of avoiding a number of technical problems that arise with the introduction of low-k materials at the CA level.

What is claimed is:

1. A semiconductor structure comprising:
    a semiconductor device;
    multiple dielectric layers stacked above said semiconductor device, said multiple dielectric layers comprising at least:
        a first dielectric layer covering said semiconductor device and extending laterally beyond said semiconductor device, said first dielectric layer comprising a conformal dielectric layer;
        a second dielectric layer covering said first dielectric layer, said second dielectric layer comprising a blanket dielectric layer; and
        a third dielectric layer covering said second dielectric layer; and
    an air gap in said second dielectric layer extending vertically from said first dielectric layer to said third dielectric layer and further aligned above said semiconductor device.

2. The semiconductor structure of claim 1, said air gap having a lower portion adjacent to said first dielectric layer and an upper portion adjacent to said third dielectric layer, said upper portion having any one of a same width as said lower portion and a greater width than said lower portion.

3. The semiconductor structure of claim 1, further comprising a plurality of contacts extending vertically through said third dielectric layer, said second dielectric layer and said first dielectric layer to said semiconductor device such that at least a portion of each of said contacts is exposed within said air gap.

4. The semiconductor structure of claim 3, said third dielectric layer further comprising a plurality of patterned openings above said semiconductor device and said multiple dielectric layers further comprising a fourth dielectric layer on said third dielectric layer and filling said openings.

5. The semiconductor structure of claim 4,
    said multiple dielectric layers further comprising a fifth dielectric layer covering said fourth dielectric layer; and
    said semiconductor structure further comprising wire interconnect structures extending vertically through said fifth dielectric layer and said fourth dielectric layer to said contacts.

6. The semiconductor structure of claim 1, said second dielectric layer comprising a different dielectric material than said first dielectric layer and said third dielectric layer.

7. A semiconductor structure comprising:
    an isolation region;
    a field effect transistor adjacent to said isolation region and comprising:
        source/drain regions and a channel region positioned laterally between said source/drain regions; and
        a gate stack on said channel region;
    multiple dielectric layers stacked above said field effect transistor and said isolation region, said multiple dielectric layers comprising at least:
        a first dielectric layer covering said source/drain regions and said gate stack of said field effect transistor and further extending laterally over said isolation region, said first dielectric layer comprising a conformal dielectric layer;
        a second dielectric layer covering said first dielectric layer, said second dielectric layer comprising a blanket dielectric layer; and
        a third dielectric layer covering said second dielectric layer; and
    an air gap in said second dielectric layer extending vertically from said first dielectric layer to said third dielectric layer, said air gap being aligned above said field effect transistor.

8. The semiconductor structure of claim 7, said air gap having a lower portion adjacent to said first dielectric layer and an upper portion adjacent to said third dielectric layer, said upper portion having any one of a same width as said lower portion and a greater width than said lower portion.

9. The semiconductor structure of claim 7, further comprising a plurality of contacts extending vertically through said third dielectric layer, said second dielectric layer and said first dielectric layer to said source/drain regions and said gate stack of said field effect transistor such that at least a portion of each of said contacts is exposed within said air gap.

10. The semiconductor structure of claim 9, said third dielectric layer further comprising a plurality of patterned openings above said field effect transistor and said multiple dielectric layers further comprising a fourth dielectric layer on said third dielectric layer and filling said openings.

11. The semiconductor structure of claim 10,
    said multiple dielectric layers further comprising a fifth dielectric layer on said fourth dielectric layer; and
    said semiconductor structure further comprising interconnect structures extending vertically through said fifth dielectric layer and said fourth dielectric layer to said contacts.

12. The semiconductor structure of claim 7, said second dielectric layer comprising a different dielectric material than said first dielectric layer and said third dielectric layer.

* * * * *